United States Patent [19]

Miner

[11] 3,927,572

[45] Dec. 23, 1975

[54] UHF TUNER DRIVE ASSEMBLY WITH MEMORY FINE TUNING

[75] Inventor: Carroll R. Miner, Wilbraham, Mass.

[73] Assignee: General Instrument Corporation, Clifton, N.J.

[22] Filed: Nov. 23, 1973

[21] Appl. No.: 418,168

[52] U.S. Cl. ............... 74/10.80; 74/10.5; 74/10.85; 334/51

[51] Int. Cl. ............................................ F16h 35/18

[58] Field of Search .............. 74/10.5, 10.54, 10.80, 74/10.85, 10.9, 10 R; 334/50, 51

[56] References Cited

UNITED STATES PATENTS

| | | | |
|---|---|---|---|
| 3,205,720 | 9/1965 | Smith | 74/10.8 |
| 3,253,240 | 5/1966 | Roussin et al. | 334/51 |
| 3,447,386 | 6/1969 | Berenbaum et al. | 74/10.8 |
| 3,474,362 | 10/1969 | Harten | 74/10.5 |
| 3,697,904 | 10/1972 | Mohri et al. | 74/10.8 |

*Primary Examiner*—Samuel Scott
*Assistant Examiner*—Randall Heald

[57] ABSTRACT

A tuner drive assembly for use with a UHF tuner mechanism of the type having a rotary control shaft includes a rotatable tuning shaft and drive means operably connected between the control shaft and the tuning shaft which are effective when actuated by the rotation of the tuning shaft to rotate the control shaft. A rotatable and axially movable turret is provided operably connected to the drive means to be driven thereby. A plurality of radially extending position adjustable elements are helically arranged on the turret. Means are provided for sequentially sensing the radial position of each of the elements as the turret is moved. The sensing means is effective to actuate the drive means to rotate the control shaft in accordance with the radial position of the elements being sensed. One position adjustable element is provided for each channel and the position thereof determines the fine tuning setting for the channel corresponding thereto. When a channel is selected by rotating the tuning shaft, the position of the corresponding element is sensed and the drive assembly automatically rotates the control shaft to select the proper fine tuning adjustment for that channel.

16 Claims, 6 Drawing Figures

UHF TUNER DRIVE ASSEMBLY WITH MEMORY FINE TUNING

The present invention relates to tuner drive assemblies and more particularly to a UHF tuner drive assembly having fine tuning memory capability.

Tuners designed when actuated to tune a receiving set such as a television receiver to a preselected one of a plurality of channels are well known and take many forms. Insofar as the present invention is concerned, the precise nature of the means employed in the communications receiver itself to effect tuning to a particular reception frequency forms no part of the present invention. What this invention is directed to is the mechanism by means of which a tuning element, whatever its character, is appropriately conditioned for precise reception of a particular channel. The invention is here specifically disclosed in connection with a tuner design to effect tuning over the entire UHF band, in which there are seventy individual channels. To provide a device capable of coarse tuning to any selected one of seventy available UHF channels with sufficient accuracy so as to be capable of distinguishing in its tuning between any two adjacent channels presents many problems, both mechanical and electrical. The public has been accustomed to step-by-step TV tuning in connection with the twelve available channels in the VHF band, and therefore expects similar tuning capability in the UHF band, but the much greater number of channels which must be tuned in the UHF band, and the very high precision of tuning which is required because of the relatively close spacing of those channels, has given rise to special new mechanical arrangements for UHF TV tuners.

With UHF tuning, as with VHF tuning, some means must be provided so that the user, once a particular channel has been selected, can fine tune the set for optimum reception. Many different manually operated arrangements have been proposed in the past for superimposing fine tuning on coarse tuning. These fine tuning arrangements have been effective to a greater or a lesser degree, depending upon the specific structure utilized. However, with each of these arrangements the viewer should separately fine tune each channel selection as it is made in order to obtain optimum reception. Even though the fine tuning setting may remain unchanged as the channel selection is changed, it is unlikely that one fine tuning setting will provide optimum reception for more than a single channel. This means that each time a different channel is selected, two separate operations must be performed, one to select the desired channel and the other to fine tune the receiver for the selected channel. Because of the extra effort involved in fine tuning the receiver each time a channel selection is made, often the viewer will disregard the fine tuning setting altogether unless the reception is extremely poor. By not fine tuning the set for each channel selected, optimum reception is normally not obtained.

Further, television receivers having remote controlled tuning are becoming increasingly common. Normally, these remote control mechanisms permit only coarse tuning and do not incorporate additional mechanisms to provide remote control fine tuning because of the cost thereof. Thus, if one selects a channel at a remote location from the receiver with a remote control unit not having fine tuning capability therein, in order to fine tune the set one must manipulate the controls on the set itself thus negating the benefit of the remote control. On the other hand, if the fine tuning controls are not set each time a channel selection is made, optimum reception is not achieved. The incorporation of remote control fine tuning into the remote control unit adds substantially to the cost of the television receiver because of the additional mechanisms which are necessary.

In order to overcome these difficulties, tuner drive assemblies have been designed with fine tuning memory capability. However, these mechanisms tend to be expensive and take up a great deal of additional space in the receiver. This is especially true when these mechanisms are utilized in UHF receivers where the capacity of the memory must be large enough to accommodate all seventy channels simultaneously. Because of the large size, high cost and low reliability of these devices they have, thus far, not been commercially feasible for use with UHF tuner drive assemblies.

The present invention provides a solution to the fine tuning problem by incorporating a simple, compact and reliable mechanism into the drive assembly which is capable of remembering the fine tuning setting for each of the seventy available UHF channels. Thus, with the present invention memory fine tuning can be incorporated into UHF receivers without substantially increasing the size or reducing the reliability thereof.

Moreover, the present invention will not appreciably add to the cost of the tuner drive assembly. This is important because set manufacturers, who as a general rule purchase tuners from tuner manufacturers, are exceedingly cost conscious. This is true particularly in view of the very high volume production which is involved wherein the savings of a few cents on a tuner, when multiplied by the number of sets made, represents a very substantial overall savings. Further, since a very large portion of TV sets sold are of the compact or semicompact type, the fine tuning mechanism of the present invention is designed to take up little additional space in the tuner and to function reliably for the life of the receiver.

It is therefore a prime object of the present invention to devise a tuner drive assembly having fine tuning memory capability for each of the UHF channels which does not substantially increase the size or complexity of the receiver.

It is a further object of the present invention to provide a tuner drive assembly in which the parts of the fine tuning mechanism are simple, inexpensive and reliable.

It is another object of the present invention to provide a tuner drive arrangement having fine tuning memory capability which can be manufacturered at a reasonable cost.

In accordance with the present invention, a tuner drive assembly for use with a tuner mechanism having a rotary control shaft is provided. The assembly includes a rotatable tuning shaft and drive means operably connected between the control shaft and the tuning shaft which is effective, when actuated by the rotation of the tuning shaft, to rotate the control shaft. The fine tuning memory comprises a rotatable and axially movable turret member which is operably connected to the drive means to be driven thereby. A plurality of radially extending position adjustable elements, one element for each channel, are helically arranged on the surface of the turret. Means are provided for sequentially sensing the radial position of each of the elements as the turret is moved. When a particular channel is selected, the turret is moved such that the sensing means is in contact with the position adjustable element which corresponds to the selected channel. The sensing means is effective to actuate the drive means to rotate the control shaft in accordance with the radial position of the element being sensed. Thus, the fine tuning for each channel is automatically accomplished as the channel is selected. Means are also provided to preset the position of each of the position adjustable elements. The portion of the drive means utilized herein to provide a linkage between the tuning shaft on one hand and the control shaft and memory fine tuning mechanism on the other is structurally similar and functionally identical to that shown in my copending application Ser. No. 272,369 entitled "Indexed TV Tuner" filed July 17, 1972. Although this may be a preferred design for the linkage in the drive means, it is not an essential portion of the present invention and any comparable design which functions in the same manner may be substituted therefor.

To the accomplishment of the above and to such other objects as they may hereinafter appear, the present invention relates to a tuner drive assembly with fine tuning memory capability as defined in the appended claims and as described in the specification, taken together with the accompanying drawings wherein like numerals refer to like parts and in which:

Figure 1:
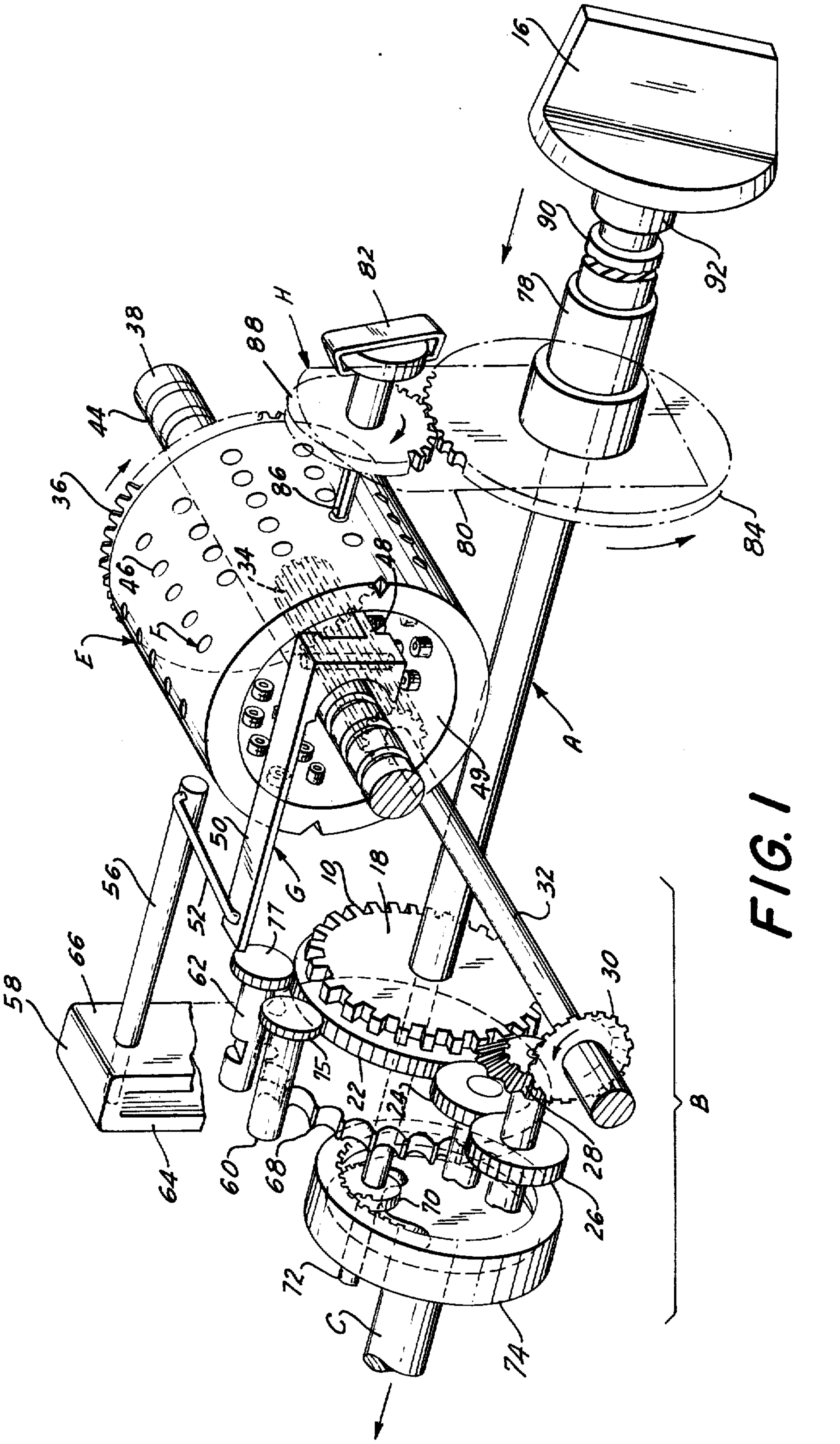
FIG. 1 is an isometric view of the tuner drive assembly of the present invention.

Broadly considered, the tuner drive assembly of the present invention comprises a rotatable input shaft, generally designated A, which is rotatable to perform channel selection. Input shaft A is operably connected to a drive means, generally designated B, which in turn is connected to rotate the rotary control shaft, generally designated C, which is the control shaft of the tuner mechanism, generally designated D. Tuner mechanism D forms no part of the present invention and therefore is not illustrated. However, tuner mechanism D may consist of a rotary variable condenser tuned transmission line or the like.

A turret assembly, generally designated E, is driven by drive means B. Turret E is rotatably and axially movable and has a plurality of position adjustable elements, generally designated F, helically arranged on the periphery thereof. A different position adjustable member F is provided for each channel. Sensing means, generally designated G, are provided to contact the position adjustable element F which corresponds to the channel which is selected. Sensing means G is operably connected to drive means B such that drive means B will rotate control shaft C in accordance with the radial position of the position adjustable element F in contact with sensing means G.

A means, generally designated H, is movably mounted on input shaft A to provide adjustment of the radial position of each of the position adjustable elements F. In this way, the fine tuning for each of the channels may be preset and if any fine tuning adjustments need be made such can be easily accomplished.

More specifically, the present invention has a housing 10 which is divided into first and second compartments 12 and 14, respectively. Input shaft A extends out the front (right as seen in the figures) of housing 10 to provide easy access thereto. Preferably, the extreme outer end of input shaft A is provided with means for mounting a control knob 16 to facilitate manipulation thereof. Input shaft A extends through the rear wall of compartment 12 and into compartment 14 and is journaled in the rear wall thereof. The rotation of input shaft A serves to rotate a detented drive wheel 18 which is fixedly mounted thereon. Wheel 18 has two sets of teeth thereon. The first set 20 act as a detent wheel in conjunction with a conventional detent mechanism (not shown) to perform the detent function in a manner well known in the art. The second set of teeth 22 on wheel 18 mesh with a gear 24 which in turn meshes with a gear 26. Gears 24 and 26 are on separate shafts, each of which is rotatably mounted to the rear wall of compartment 12. Mounted on the same shaft as gear 26 is a bevel gear 28 which in turn meshes with a second bevel gear 30. Bevel gear 30 is fixedly mounted on shaft 32 each end of which is journaled in an opposite side of compartment 12. Thus, the rotation of input shaft A is transferred to shaft 32 by means of wheel 18, and gears 24, 26, 28 and 30.

A spline gear 34 having a length at least equal to the distance of axial movement of turret E is fixedly mounted on shaft 32. Spline gear 34 meshes with gear 36 whose teeth are fixed along the periphery of one end of turret E. Turret E is rotatably mounted on a nonrotatable axle 38 which is fixed to either side of compartment 12 by means of screws 40 and 42. Axle 38 is provided with a helical groove 44 along the periphery thereof. Shaft 32, which passes along the outside of turret E, rotates turret E by means of the meshing of spline gear 34 and gear 36 such that turret E axially moves along axle 38 as it is rotated. Thus, the rotation of input shaft A causes turret E to rotate and move axially simultaneously therewith. A plurality of internally threaded apertures 46 are provided through the surface of turret E. A different externally threaded position adjustable element F is situated in each of the apertures 46. Normally, an aperture and an element F is provided for each channel which can be selected by the tuner. Since the present invention is shown for use with a UHF tuning mechanism which is capable of tuning stations, the turret is illustrated as having seventy position adjustable elements F thereon. Preferably, these seventy elements are arranged in ten rows situated parallel to axle 38 consisting of seven elements each. Each row is rotationally displaced from its neighboring row by 36° and axially displaced therefrom (along a line parallel to axle 38) by one-tenth of the pitch of helical groove 44. For instance, if the pitch of helical groove 44 is one-eighth inch, then each row will be axially displaced along a line parallel to axle 38 from its neighboring row by one-tenth of one-eighth of an inch or 0.012 of an inch. In this way, position adjustable elements F form a helical pattern on the surface of turret E.

Figure 3:
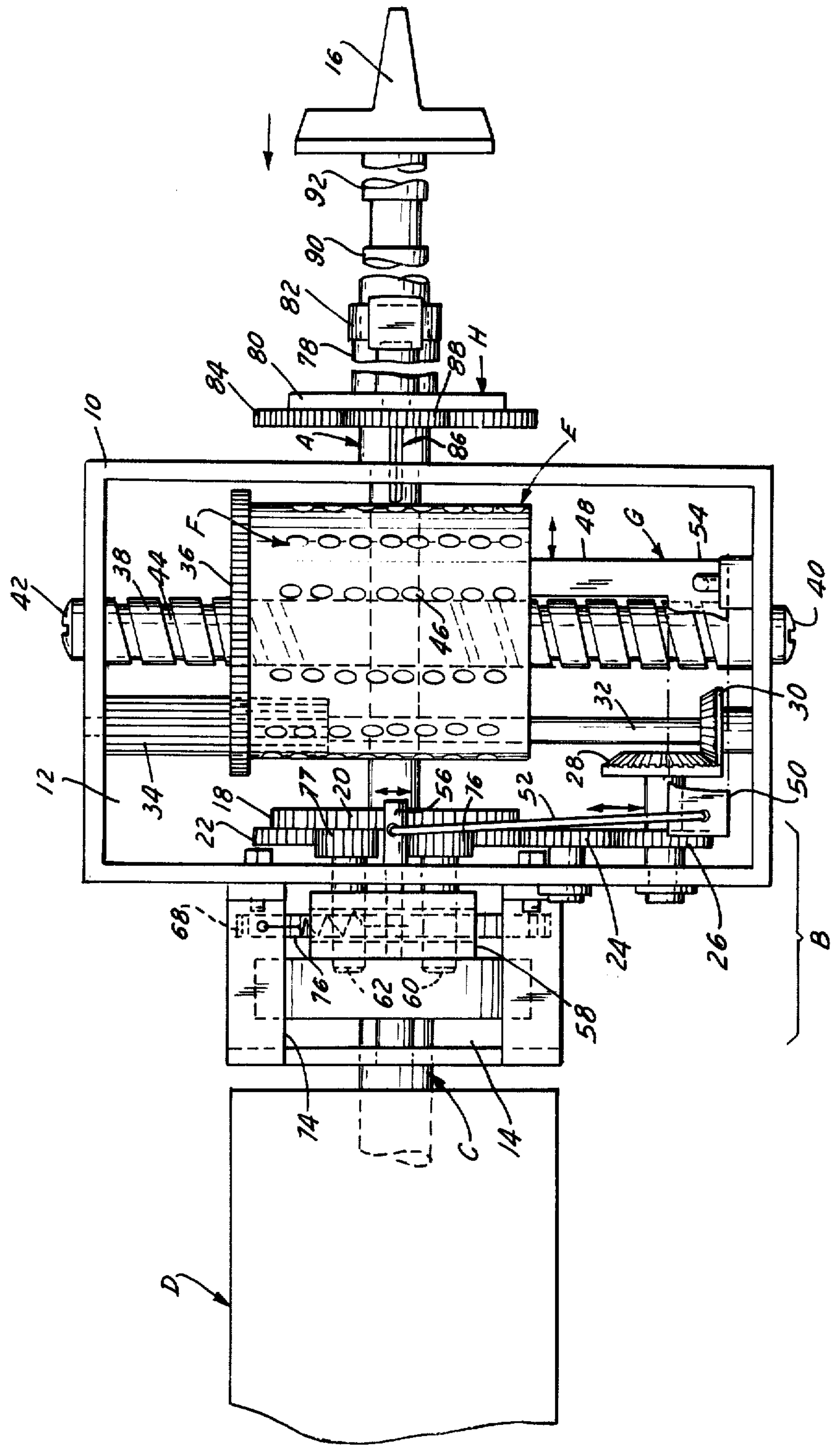
FIG. 3 is a top elevational view of the tuner drive assembly of the present invention.
Figure 4:
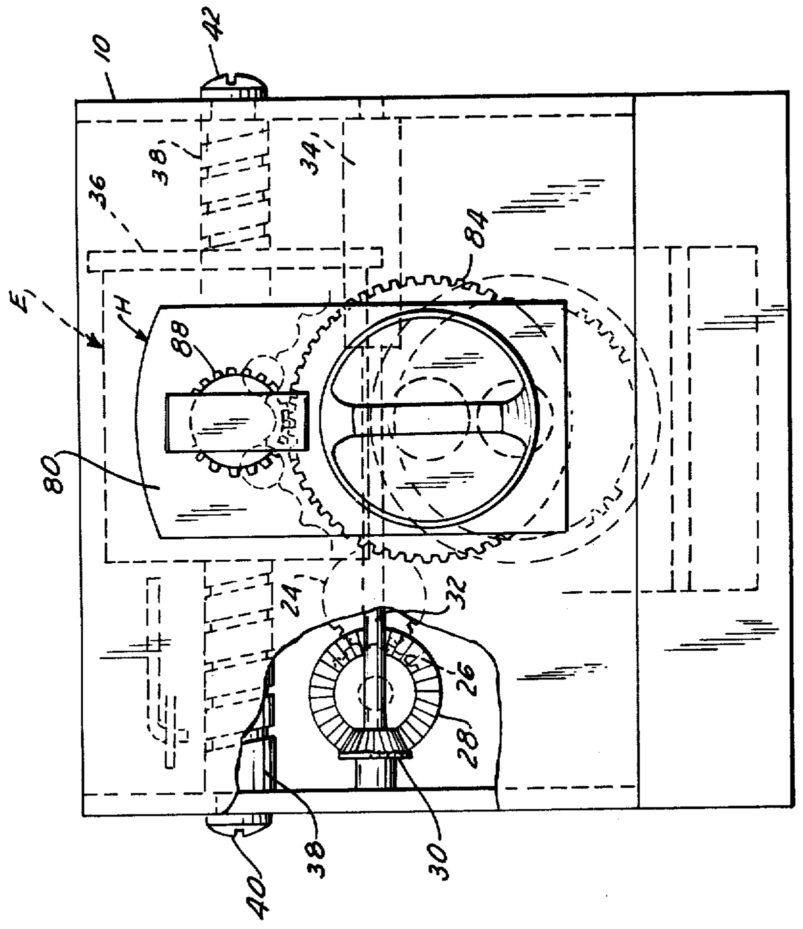
FIG. 4 is a front elevational view of the tuner drive assembly of the present invention with a portion of the housing removed.

Sensing means G is positioned to contact the element F which corresponds to the channel selected. The appropriate element F is brought into contact with sensing means G by the interconnection between the rotation of input shaft A and the rotation and axial movement of turret E. Since the movement of turret E is synchronized with the rotation of input shaft A, and because of the arrangement of elements F on the surface of turret E, the appropriate element F is brought into contact with sensing means G as the channel is selected such that fine tuning of the channel selected may be achieved. Sensing means G comprises a member 48 which extends into the interior of turret E through the open end 49 thereof to contact the position adjustable element F corresponding to the channel selected. Member 48 is fixedly mounted on a body 50 which in turn is pivotally mounted to the side wall of section 12. Body 50 is provided with a front section 54 having a semicircular cutout portion which permits pivotal movement of body 50 without interference from axle 38. Body 50 is operably connected to a rod 56 by means of connecting member 52. Thus, the radial position of the position adjustable element F in contact with member 48 will cause body 50 to pivot thereby causing rod 56 to be displaced along a path indicated by the arrows in FIG. 3. Preferably, the inner tip of each of the position adjustable elements F has a rounded configuration such that as turret E is rotated the tip portion of each successive element F smoothly contacts member 48 thereby causing body 50 to pivot through the appropriate angle.

A bracket 58 having a generally U-shaped cross-section is rotationally mounted to the end of rod 56 and additionally rotationally mounted about shaft A. The top of bracket 58 will therefore move along with the rod 56 in a curved line having shaft A as a center point which lies in a plane parallel to the rear wall of compartment 12. A pair of shafts 60 and 62 are rotatably mounted on bracket 58 in a side-by-side relationship. Each of the shafts 60 and 62 is journaled in the rear wall 64 of bracket 58. Shafts 60 and 62 also pass through the rear wall of compartment 12 through an opening thereon provided for this purpose. Between the rear wall 64 and the front wall 66 of bracket 58 is situated an index wheel 68. Wheel 68 is also rotatably mounted on input shaft A. Wheel 68 is operably connected to a gear 70 by means of a shaft 72 which is freely rotatably mounted on and coaxial with input shaft A. Thus, the rotation of wheel 68 will in turn rotate gear 70. Gear 70 meshes with the internally situated teeth of a gear 74 which is fixedly mounted to rotary control shaft C. Thus, the rotation of wheel 68 controls the rotation of shaft C through gears 70 and 74. A slot 73 is provided in the rear wall of gear 74 to provide clearance for shaft 72 which is journaled in the rear wall of compartment 14.

Shafts 60 and 62 comprise the link between the teeth 22 on wheel 18 and wheel 68. Each of the shaft 60 and 62 has a pinion gear 75 and 77, respectively, affixed to its forward (right in the drawings) end. Each of these pinion gears 75 and 77 meshes with teeth 22 such that both shaft 60 and shaft 62 are rotated by the rotation of input shaft A. Each of the shafts 60 and 62 is provided with a recessed or cut-out portion having a cross-section of a segment of a circle. It is this point (immediately adjacent the recess) that each of the shafts 60 and 62 respectively engages wheel 68 at spaced locations along the periphery thereof. Shafts 60 and 62 are 180° out-of-phase in angular relation such that only one of the shafts is in a locked or engaged position with wheel 68 at a given instant. The other shaft is in an inactive or disengaged relationship with wheel 68. The function of the recessed portions of shafts 60 and 62 is perhaps best seen in FIG. 6. This drawing shows shaft 60 in its engaged position with wheel 68 as the solid part below the recessed portion is situated in the recess between two teeth on wheel 68. Shaft 62, on the other hand, is shown in the inactive or disengaged position wherein the tooth of wheel 68 is situated within the recessed portion and therefore does not engage the shaft. Shafts 60 and 62 serve to link wheel 18 to wheel 68. This linkage, however, causes a continuous rotation of wheel 18 to be translated into an intermittent rotation of wheel 68 because of the recessed portions on the shafts 60, 62.

Preferably, movement of wheel 18 from one detented position to the next, which corresponds to changing channels from one channel to the next, will cause a 180° rotation of each of the shafts 60 and 62. During a portion of this 180° rotation, the rotation of wheel 68 will occur. During the remaining of the 180° rotation, no rotation of wheel 68 will occur as the shafts are permitted to idle during this period. Within limits, the 180° rotation can be divided between its active portion and its idling portion, as desired. Although it is preferable to divide these portions evenly such that a shaft dwell angle of approximately 90° is obtained, it is possible to design the shafts to have somewhat greater dwell angle. When this is done however, the extra dwell angle subtracts from the available part of the 180° rotation for channel changing action and this can lead to less smooth action of the assembly and possible shortening of life. During the dwell angle of shafts 60 and 62, the fine tuning function is performed. A dwell angle of 90° is more than adequate to achieve a fine tuning range of about one channel (six MHZ), which is the usual range provided for fine tuning.

Figure 5:
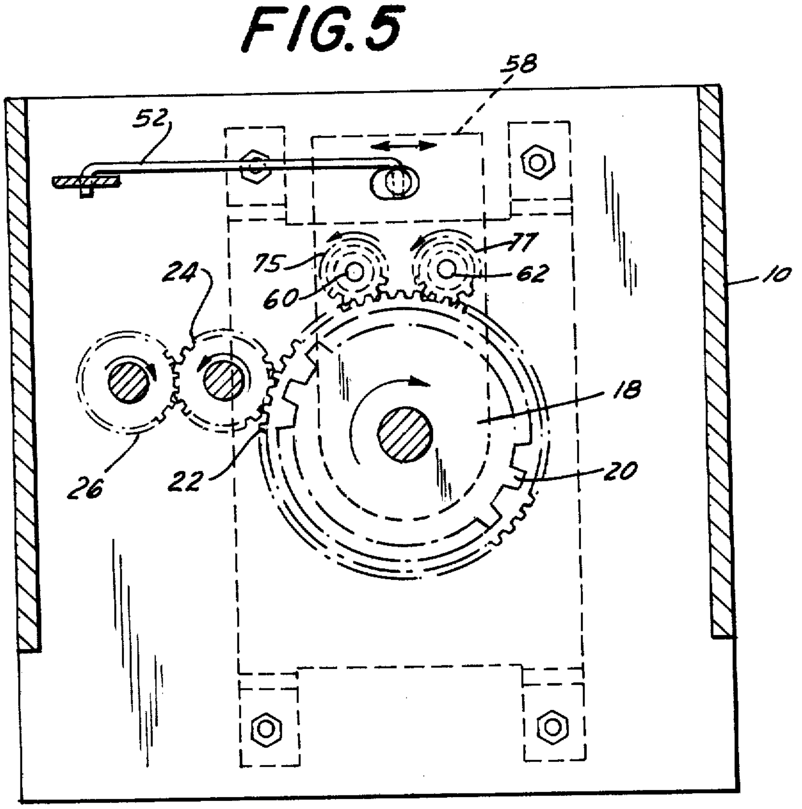
FIG. 5 is a view of the tuner drive assembly of the present invention taken along line 5—5 of FIG. 2.
Figure 6:
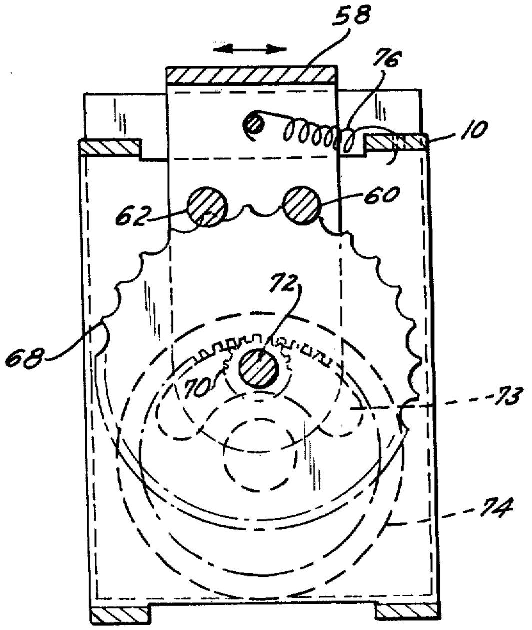
FIG. 6 is a view of the tuner drive assembly of the present invention taken along line 6—6 of FIG. 2.

Since shafts 60 and 62 are rotatably mounted on bracket 58, the translation of bracket 58 caused by sensing means G, will in turn cause bracket 58 to move back and forth along a curved arc in the manner shown by the arrows in FIGS. 5 and 6. The back and forth movement of shafts 60 and 62 will cause a relatively small rotation of wheel 68. Since wheel 68 is operably connected to gear 70 which in turn rotates gear 74 and rotary control shaft C, the translation of shafts 60 and 62 cause a relatively small rotation of tuner control shaft C which conditions the tuning mechanism to achieve fine tuning. Because the translation of shafts 60 and 62 occurs during the dwell angle, the translation causes a rotation of shafts 60 and 62 which does not affect the rotational position of wheel 18, hence not adversely affecting the channel setting. As shown in FIG. 6, the upper portion of housing 10 of compartment 14 is provided with an aperture which permits clearance for bracket 58 to move back and forth relative to housing 10. Also, a tension spring 76 is provided connected between bracket 58 and housing 10 to bias bracket 58 such that rod 48 of sensing means G is kept in contact with the appropriate position adjustable element F.

Figure 2:
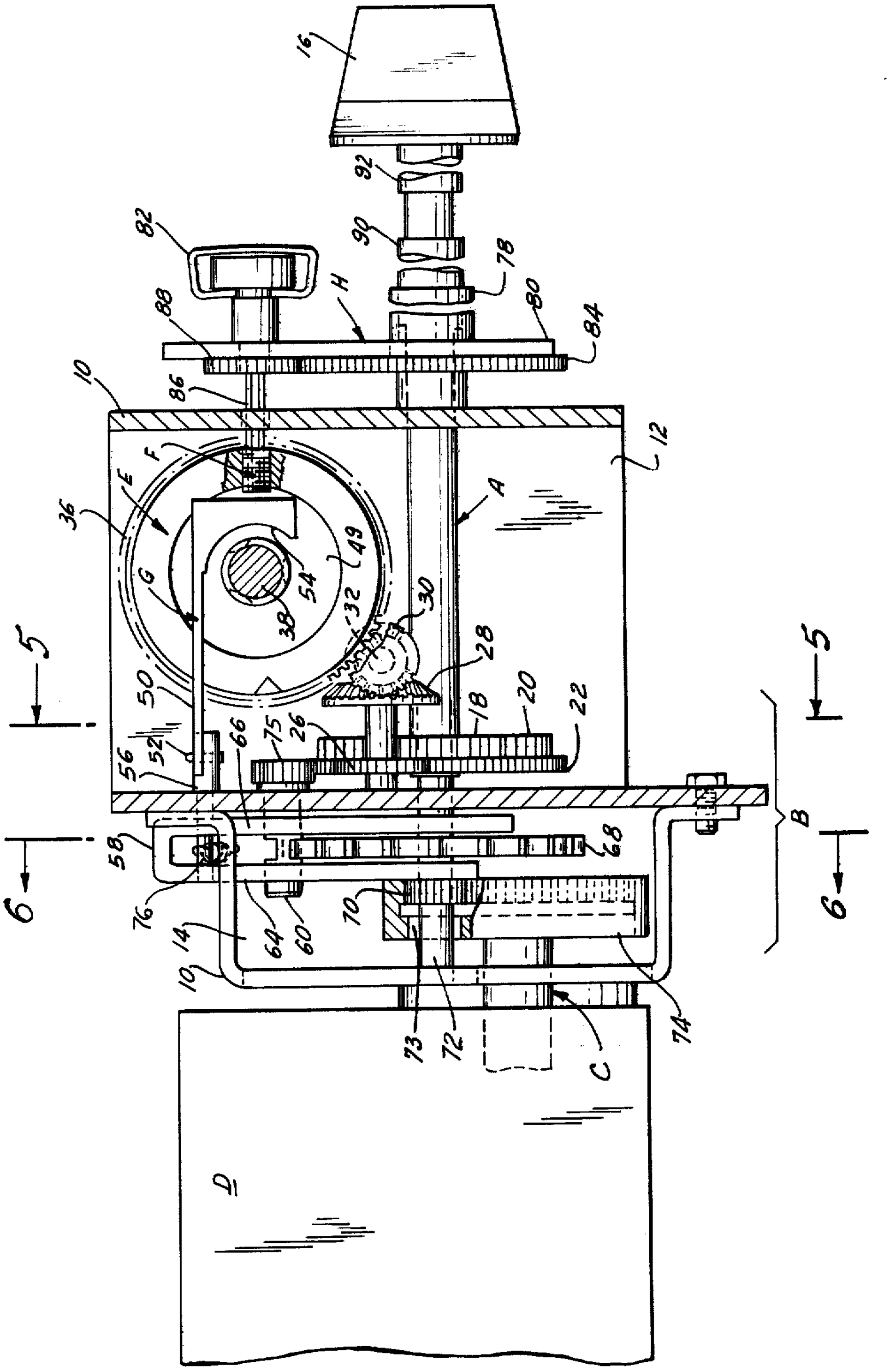
FIG. 2 is a side elevational view of the tuner drive assembly of the present invention.

In order to adjust the radial position of each of the position adjustable elements F, input shaft A is provided with a freely rotatable collar 78 which is spring loaded by a spring (not shown). Collar 78 is axially movable along a portion of input shaft A. Preferably, a fine tuning knob (not shown) is provided which is mounted on collar 78 and accessible to the exterior of the receiver such that the viewer may depress the fine tuning knob and rotate same to adjust the radial position of the position adjustable element F corresponding to the channel to which the tuner is set. Mounted directly behind collar 78 on shaft A is a movable plate 80 which carries on it an override clutch 82 at a location spaced from shaft A and directly in front of turret E. A gear 84 is fixedly mounted to collar 78 and rotatably mounted on shaft A such that it is driven by the rotation of collar 78. A driver 86 is provided fixedly mounted on a gear 88 which in turn is rotationally mounted on plate 80. When collar 78 is depressed (moved towards the left as shown in the drawings), it will be positioned as shown in FIG. 2. The movement of collar 78 will move plate 80 and therefore gears 84, 88, override clutch 82 and driver 86 towards housing 10. Housing 10 is provided with an aperture into which driver 86 is normally inserted. Before plate 80 is moved toward housing 10, the tip of driver 86 is not inserted within compartment 12 far enough to communicate with elements F on turret E. However, when collar 78 is depressed, the entire assembly is moved towards housing 10 and driver 86 is inserted more deeply therein. The movement of the fine tuning assembly H causes the tip of driver 86 to contact the position adjustable element which corresponds to the channel to which the receiver is tuned. Preferably, each of the position adjustable elements F takes the form of a screw having a head with a hexagonal recess therein. The tip of driver 86 is hexagonally shaped to engage the recess on element F. In this way, when collar 78 is depressed and the fine tuning knob rotated, the rotation is transferred to driver 86 which in turn rotates the element F aligned therewith to change its radial position. Since the radial position of element F determines the fine tuning setting for that channel, this in effect is a way of adjusting the fine tuning as well as setting the memory such that whenever the receiver is again tuned to this channel, the position of element F corresponding thereto, (which will not change during the interim) will again cause the tuner drive assembly to set the fine tuning for this channel. In this way, the fine tuning for each channel can be set, and once set will rarely need further adjustment. However, if such further adjustment should be needed, it is easily achieved.

Preferably, the tuner drive assembly of the present invention is provided with capability for connecting to a means for indicating which channel is selected. Although this indicating means is not shown, sleeve 90 is provided for mounting of a "tens" read-out dial. Sleeve 90 is driven by a decade counter pinion (not shown) in the conventional manner so that the channel numbers may be displayed on two radial dials, using shaft 92 for the "units" dial and sleeve 90 for the "tens" dial, in the well-known manner. Further, although the rear portion of shaft A is shown in FIG. 2 as being journaled in the rear wall of compartment 14, this shaft may be extended past tuner D and connected for motor driving of the tuner by the addition of a motor mounted on the rear plate of the tuner. This motor may be connected to a remote control mechanism, if desired.

While but a single embodiment of the present invention has been here specifically disclosed for purposes of illustration, it is apparent that many variations and modifications may be made therein. It is intended to cover all of these variations and modifications which fall within the scope of the invention as defined by the following claims.

I claim:

1. A tuner drive assembly for use with a tuner mechanism having a control shaft comprising a tuner shaft, a rotationally and axially movable hollow cylinder operably connected to said tuning shaft to be driven thereby, a plurality of adjustable position elements helically arranged on said cylinder so as to extend inwardly into the hollow of said cylinder, means extending into said cylinder for sequentially sensing the radial position of each of said elements as said cylinder is moved, said sensing means being operably connected to said control shaft to move the latter in accordance with the radial position of the element being sensed.

2. The assembly of claim 1 further comprising means for adjusting the radial position of each of said elements.

3. The assembly of claim 2 wherein said cylinder is mounted on a nonrotatable helically grooved axle such that the rotation of said cylinder causes said cylinder to axially move along said axle.

4. The assembly of claim 1 wherein said cylinder is mounted on a nonrotatable helically grooved axle such that the rotation of said cylinder causes said cylinder to axially move along said axle.

5. The assembly of claim 3 wherein the driving connection between said tuning shaft and said cylinder comprises a spline gear rotated by said tuning shaft and having a length at least equal to the distance of axial movement of said cylinder and a gear fixed to the periphery of said cylinder which meshes with said spline gear such that the rotation of said spline gear is transferred to said cylinder as said cylinder axially moves along said axle.

6. The assembly of claim 4 wherein the driving connection between said tuning shaft and said cylinder comprises a spline gear rotated by said tuning shaft and having a length at least equal to the distance of axial movement of said cylinder and a gear fixed to the periphery of said cylinder which meshes with said spline gear such that the rotation of said spline gear is transferred to said cylinder as said cylinder axially moves along said axle.

7. A tuner drive assembly for use with a tuner mechanism having a control shaft comprising a tuning shaft, a rotatable and axially movable cylinder operably connected to said tuning shaft to be driven thereby, a plurality of adjustable position elements helically arranged on said cylinder, means for sequentially sensing the position of each of said elements as said cylinder is moved, said sensing means being operably connected to said control shaft to move the latter in accordance with the position of the element being sensed.

8. The assembly of claim 7 wherein said cylinder is mounted on a nonrotatable helically grooved axle such that the rotation of said cylinder causes said cylinder to axially move along said axle.

9. The assembly of claim 7 wherein said sensing means comprises a pivotally mounted sensing arm adopted to contact one of said elements and biasing means operably connected to said arm for urging said arm towards said contacted element.

10. The assembly of claim 7 further comprising means for adjusting the position of each of said elements.

11. The assembly of claim 9 further comprising means for adjusting the position of each of said elements.

12. The assembly of claim 8 further comprising means for adjusting the radial position of each of said elements.

13. The assembly of claim 12 wherein said sensing means comprises a pivotally mounted sensing arm adopted to contact one of said elements and biasing means operably connected to said arm for urging said arm towards said contacted element.

14. The assembly of claim 10 wherein said adjusting means being located outside said cylinder in registration with the element being sensed and movable between a first position relatively remote from said cylinder and a second position when said element being sensed is engaged by said adjusting means.

15. The assembly of claim 11 wherein said adjusting means being located outside said cylinder in registration with the element being sensed and movable between a first position relatively remote from said cylinder and a second position when said element being sensed is engaged by said adjusting means.

16. The assembly of claim 12 wherein said adjusting means being located outside said cylinder in registration with the element being sensed and movable between a first position relatively remote from said cylinder and a second position when said element being sensed is engaged by said adjusting means.

* * * * *